(12) United States Patent
Cai et al.

(10) Patent No.: US 9,608,125 B2
(45) Date of Patent: Mar. 28, 2017

(54) DISPLAY SUBSTRATE, ITS TESTING METHOD AND ITS MANUFACTURING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhenfei Cai, Beijing (CN); Jian Chen, Beijing (CN); Chaohuan Hsu, Beijing (CN); Zhengwei Chen, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 73 days.

(21) Appl. No.: 14/803,264

(22) Filed: Jul. 20, 2015

(65) Prior Publication Data
US 2016/0146880 A1    May 26, 2016

(30) Foreign Application Priority Data
Nov. 25, 2014 (CN) .......................... 2014 1 0692290

(51) Int. Cl.
B05D 1/02 (2006.01)
G01R 31/00 (2006.01)
H01L 29/786 (2006.01)
H01L 27/12 (2006.01)
H01L 21/66 (2006.01)

(52) U.S. Cl.
CPC .......... H01L 29/7869 (2013.01); H01L 22/34 (2013.01); H01L 27/127 (2013.01); H01L 27/1225 (2013.01)

(58) Field of Classification Search
CPC ... B05D 1/02; B05D 1/18; B05D 1/28; B05D 3/06; B05D 5/00; H05K 1/181; H05K 1/115; H05K 1/0298; G01N 27/048; G01N 27/20; G01N 27/04
USPC ............ 324/757.02, 763.01, 750.26, 762.01, 324/762.05, 719, 71.5, 765, 437, 760.02, 324/445–446, 754.07, 755.01, 765.03, 324/758.01, 750.16, 690–696, 724
See application file for complete search history.

(56) References Cited

U.S. PATENT DOCUMENTS

| | | | |
|---|---|---|---|
| 2004/0041641 A1* | 3/2004 | Nakajima ............ | G01R 31/275 331/57 |
| 2007/0018680 A1* | 1/2007 | Jeon ....................... | G09G 3/006 324/750.3 |
| 2008/0180126 A1* | 7/2008 | Okayasu ........... | H01L 21/76254 324/750.15 |
| 2009/0079446 A1* | 3/2009 | Chatterjee .......... | G01R 31/2621 324/719 |

(Continued)

*Primary Examiner* — Arleen M Vazquez
*Assistant Examiner* — Taqi Nasir
(74) *Attorney, Agent, or Firm* — Bakerhostetler LLP

(57) ABSTRACT

The present disclosure provides a display substrate, its testing method and its manufacturing method. A first testing terminal is connected to a gate electrode of a first TFT, a second testing terminal is connected to a source electrode of the first TFT and a drain electrode of a second TFT, a third testing terminal is connected to a gate electrode of the second TFT, and a fourth testing terminal is connected to a drain electrode of the first TFT and a source electrode of the second TFT.

20 Claims, 5 Drawing Sheets

(56) References Cited

U.S. PATENT DOCUMENTS

| | | | | |
|---|---|---|---|---|
| 2010/0134125 A1* | 6/2010 | Aubel | ............... | H01L 22/34 |
| | | | | 324/719 |
| 2012/0001616 A1* | 1/2012 | Fife | ............... | H01L 27/14632 |
| | | | | 324/71.5 |
| 2012/0025862 A1* | 2/2012 | Chumakov | ......... | H01L 22/12 |
| | | | | 324/762.01 |
| 2013/0015876 A1* | 1/2013 | Lai | ............... | G01R 31/2642 |
| | | | | 324/762.01 |

* cited by examiner

DISPLAY SUBSTRATE, ITS TESTING METHOD AND ITS MANUFACTURING METHOD

CROSS-REFERENCE TO RELATED APPLICATION

The present application claims a priority of the Chinese patent application No. 201410692290.0 filed on Nov. 25, 2014, which is incorporated herein by reference in its entirety.

TECHNICAL FIELD

The present disclosure relates to the field of display technology, in particular to a display substrate, its testing method and its manufacturing method.

BACKGROUND

Currently, for such well-known display devices as a liquid crystal display (LCD), an electroluminescence (EL) display panel and an electronic paper, thin film transistors (TFTs) for controlling pixel switches are arranged on a display substrate for achieving a display function. As the switches for the pixels, these TFTs are used to control the transmission of data signals from data lines into the pixels, so as to display an image. However, during the actual manufacture of the display substrates, usually there are differences in TFT characteristics between different display substrates and between different regions of an identical display substrate due to an unstable process capability. When a defective process step remains unknown, a technician may select a new set of glass substrates and rotate them prior to different process steps. After the display substrates have been completed, the TFT characteristics of these display substrates may be tested, and then compared with the TFT characteristics of the previous display substrates, so as to find the problems in devices for manufacturing the display substrates, thereby to improve the process as well as the product quality.

For an existing process for manufacturing a TFT array substrate, its TFT characteristics may be monitored and tested by forming a TFT at a peripheral region of the display substrate identical to that at a pixel region, and a gate electrode, a source electrode and a drain electrode of the TFT are connected to testing terminals G, S and D, respectively. In addition, usually a vacant testing terminal E is also provided. As shown in FIGS. 1a and 1b, when the TFT characteristics are tested, usually a voltage signal of −30V to 30V is applied to the testing terminal G, a constant signal of 15V is applied to the testing terminal S, a change in a current flowing through the TFT is collected by the testing terminal D, and no signal is applied to the testing terminal E. Probes of a testing device are located at fixed positions, i.e., at four vertices of a square, and spaced apart from each other at an interval of 700 μm. During the TFT characteristics testing, the signals are applied to the testing terminal G and the testing terminal S in FIG. 1a through the probes of the testing device before rotation of the display substrate, and a collected current signal is transmitted by the testing terminal D through the probes to the testing device, so as to collect testing data. Identically, after the display substrate is rotated by 180°, the signals are applied to the testing terminal G and the testing terminal S in FIG. 1b through the probes, the collected current signal is transmitted by the testing terminal D through the probes to the testing device, so as to collect the testing data. By comparing the testing data collected before and after the rotation of the display substrate, it is able to find the problems in devices for manufacturing the display substrate, thereby to improve the process as well as the product quality.

However, during the above testing, as shown in FIGS. 1a and 1b, the TFT and the testing terminals rotate along with the display substrate, but the positions of the four probes of the testing device are fixed. Hence, it is required to change the positions of the probes and the applied signals, thereby to test the TFT characteristics normally before and after the rotation. As a result, the testing is complicated and time-consuming.

Hence, there is an urgent need to simplify the testing of the display substrate and find the problems in the manufacturing process rapidly, thereby to improve the testing efficiency, the manufacturing process and the product quality.

SUMMARY

An object of the present disclosure is to provide a display substrate, its testing method and its manufacturing method, so as to prevent the testing of the display substrate from being complicated and time-consuming.

In one aspect, the present disclosure provides a display substrate, including at least one testing region, wherein a first thin film transistor (TFT) and a second TFT with an identical size and an identical polarity, a first testing terminal, a second testing terminal, a third testing terminal and a fourth testing terminal are arranged at the testing region. The first testing terminal is connected to a gate electrode of the first TFT, the second testing terminal is connected to a source electrode of the first TFT and a drain electrode of the second TFT, the third testing terminal is connected to a gate electrode of the second TFT, and the fourth testing terminal is connected to a drain electrode of the first TFT and a source electrode of the second TFT.

In an alternative embodiment, the testing region is of a rectangle shape, the first testing terminal and the third testing terminal are arranged at two diagonal vertices of the rectangle, respectively, and the second testing terminal and the fourth testing terminal are arranged at the other two diagonal vertices of the rectangle, respectively.

In an alternative embodiment, the gate electrode of the first TFT is arranged at a layer identical to the gate electrode of the second TFT, an active layer of the first TFT is arranged at a layer identical to an active layer of the second TFT, and the source/drain electrodes of the first TFT are arranged at a layer identical to the source/drain electrodes of the second TFT.

In an alternative embodiment, the gate electrodes of the first TFT and the second TFT are arranged at a layer identical to the first testing terminal and the third testing terminal.

In an alternative embodiment, the source/drain electrodes of the first TFT and the second TFT are arranged at a layer identical to the second testing terminal and the fourth testing terminal.

In an alternative embodiment, the display substrate further includes a display region, wherein a plurality of TFTs for displaying is arranged at the display region. The gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

In another aspect, the present disclosure provides a method for testing the above-mentioned display substrate, including steps of:

applying by a first probe a gate voltage signal to a first testing terminal, applying by a second probe a data signal to a second testing terminal, and collecting by a fourth probe a drain current signal of a first TFT through a fourth testing terminal;

rotating the display substrate by 180°;

applying by the first probe a gate voltage signal to a third testing terminal, applying by the second probe a data signal to the fourth testing terminal, and collecting by the fourth probe a drain current signal of the second TFT through the second testing terminal; and comparing the drain current signal of the first TFT and the drain current signal of the second TFT collected by the fourth probe, thereby determining whether or not the display substrate is defective.

In an alternative embodiment, the gate voltage signal applied by the first probe to the third testing terminal is identical to the gate voltage signal applied by the first probe to the first testing terminal, and the data signal applied by the second probe to the fourth testing terminal is identical to the data signal applied by the second probe to the second testing terminal.

In yet another aspect, the present disclosure provides a method for manufacturing the above-mentioned display substrate, including steps of:

forming patterns of a gate electrode of a first TFT, a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

According to the display substrate, its testing method and its manufacturing method in the embodiments of the present disclosure, the first testing terminal is connected to the gate electrode of the first TFT, the second testing terminal is connected to the source electrode of the first TFT and the drain electrode of the second TFT, the third testing terminal is connected to the gate electrode of the second TFT, and the fourth testing terminal is connected to the drain electrode of the first TFT and the source electrode of the second TFT. During the testing, the gate voltage signal applied by the first probe to the third testing terminal before the rotation of the display substrate by 180° is identical to the gate voltage signal applied by the first probe to the first testing terminal before the rotation of the display substrate, and the data signal applied by the second probe to the fourth testing terminal after the rotation of the display substrate by 180° is identical to the data signal applied by the second probe to the second testing terminal before the rotation of the display substrate. Different from the related art, it is unnecessary in the embodiments of the present disclosure to test the display substrate by changing the positions of the probes and the applied signals after the rotation of the display substrate by 180°. As a result, it is able to prevent the testing of the display substrate from being complicated and time-consuming and find the problems in the manufacturing process of the display substrate, thereby to improve the testing efficiency, the manufacturing process and the product quality.

DETAILED DESCRIPTION

The present disclosure will be described hereinafter in conjunction with the drawings and embodiments.

Figure 1A:
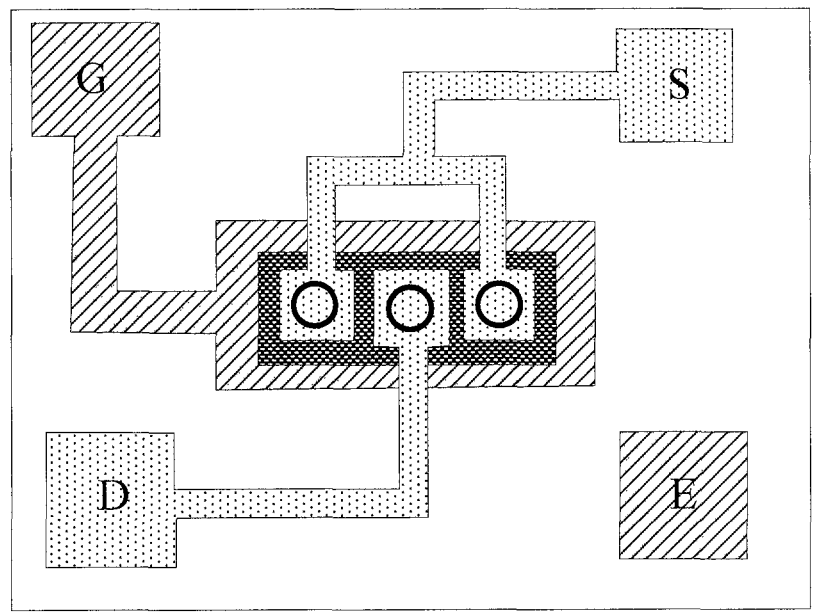
FIGS. 1a and 1b are schematic views showings the situations where a TFT is tested before and after a display substrate is rotated by 180° in the related art.
Figure 1B:
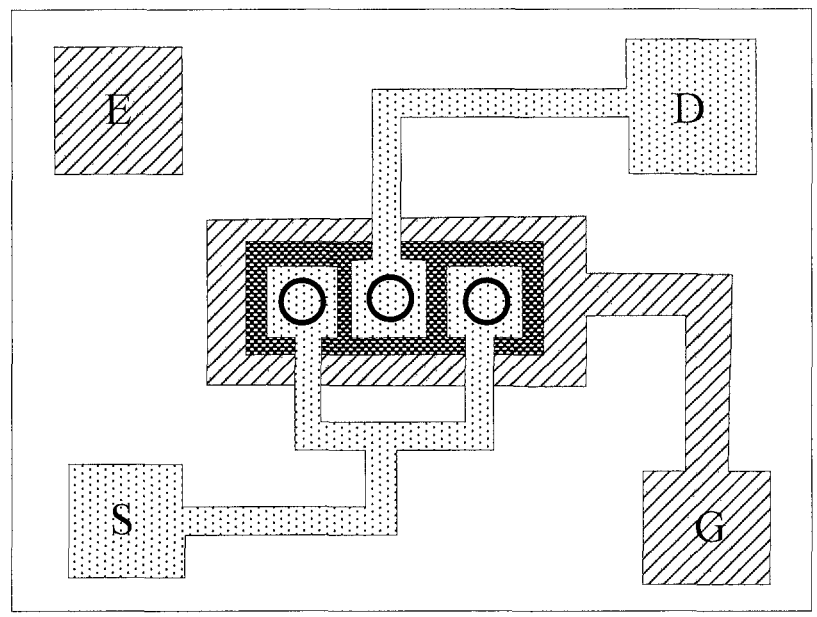
Figure 2A:
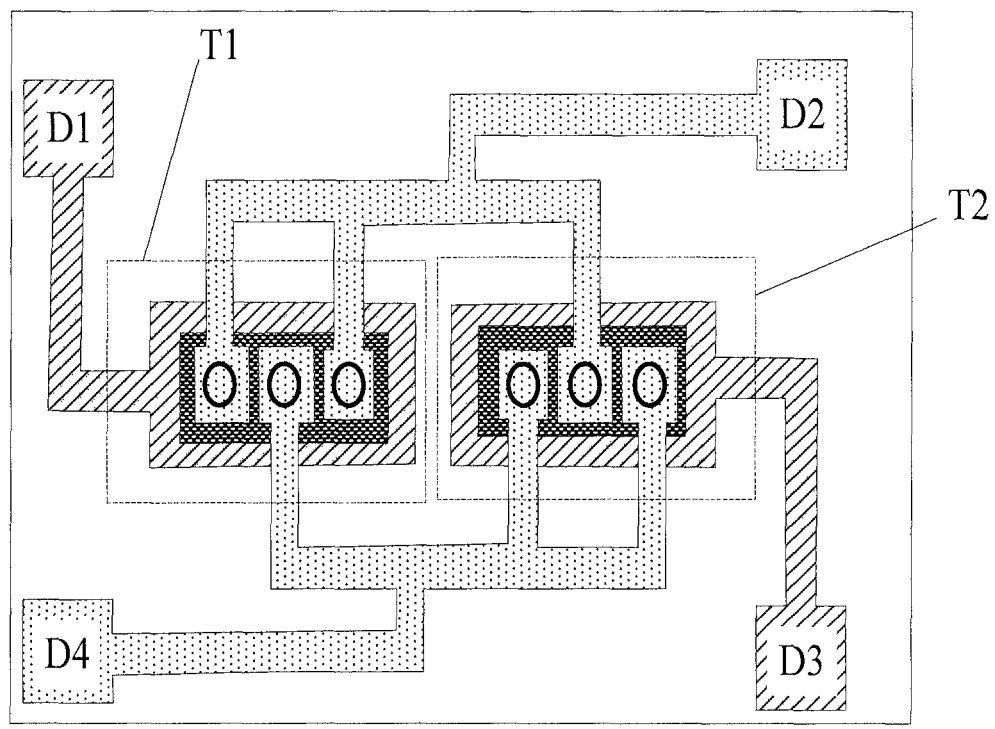
FIGS. 2a and 2b are schematic views showing the situations where a first TFT and a second TFT are tested before and after a display substrate is rotated by 180° according to embodiments of the present disclosure.
Figure 2B:
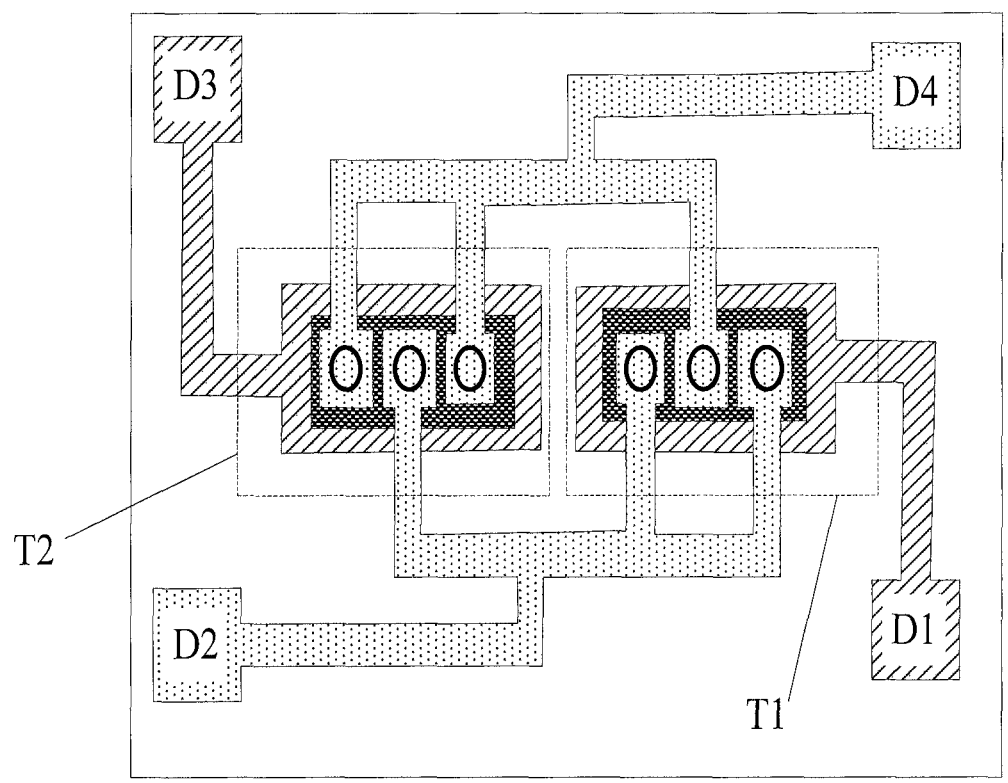

The present disclosure provides in an embodiment a display substrate including at least one testing region, as shown in FIGS. 2a and 2b, a first TFT T1 and a second TFT T2 with an identical size and an identical polarity, a first testing terminal D1, a second testing terminal D2, a third testing terminal D3 and a fourth testing terminal D4 are arranged at the testing region. The first testing terminal D1 is connected to a gate electrode of the first TFT T1, the second testing terminal D2 is connected to a source electrode of the first TFT T1 and a drain electrode of the second TFT T2, the third testing terminal D3 is connected to a gate electrode of the second TFT T2, and the fourth testing terminal D4 is connected to the drain electrode of the first TFT T1 and a source electrode of the second TFT T2.

In the display substrate, the first TFT T1 is of a structure, size and polarity completely identical to those of the second TFT T2, i.e., the first TFT T1 and the second TFT T2 may be p-type TFTs, or n-type TFTs. During the testing, as shown in FIG. 2a, a gate voltage signal may be applied by a first probe to the first testing terminal D1, and a data signal may be applied by a second probe to the second testing terminal D2, so as to test the characteristics of the first TFT T1. As shown in FIG. 2b, after the rotation of the display substrate by 180°, a gate voltage signal may be applied by the first probe to the third testing terminal D3 and a data signal may be applied by the second probe to the fourth testing terminal D4, so as to test the characteristics of the second TFT T2. During the testing, the gate voltage signal applied by the first probe to the third testing terminal D3 after the rotation of the display substrate by 180° is identical to the gate voltage signal applied by the first probe to the first testing terminal D1 before the rotation of the display substrate, and the data signal applied by the second probe to the fourth testing terminal D4 after the rotation of the display substrate by 180° is identical to the data signal applied by the second probe to the second testing terminal D2 before the rotation of the display substrate. Different from the related art, it is unnecessary in the embodiments of the present disclosure to change the positions of the probes and the applied signals after the rotation of the display substrate by 180°. It is unnecessary in the embodiments of the present disclosure to test the display substrate by changing the positions of the probes and the applied signals after the rotation of the display substrate by 180°. As a result, it is able to prevent the testing of the display substrate from being complicated and time-consuming and find the problems in the manufacturing process of the display substrate, thereby to improve the testing efficiency, the manufacturing process and the product quality.

During the implementation, as shown in FIGS. 2a and 2b, the testing region may be of a rectangle shape, the first testing terminal D1 and the third testing terminal D3 are arranged at two diagonal vertices of the rectangle, respectively, and the second testing terminal D2 and the fourth testing terminal D4 are arranged at the other two diagonal vertices of the rectangle.

To be specific, for the display substrate where the first testing terminal D1, the second testing terminal D2, the third testing terminal D3 and the fourth testing terminal D4 are arranged in the above-mentioned manner, after the display substrate is rotated by 180°, the positions of the first testing terminal D1 and the third testing terminal D3 are interchanged, and the positions of the second testing terminal D2 and the fourth testing terminal D4 are interchanged. In this way, the same gate voltage signal may be applied by the first probe to the first testing terminal D1 and the third testing terminal D3, and the same data signal may be applied by the second probe to the second testing terminal D2 and the fourth testing terminal D4. As a result, it is unnecessary to change the positions of the probes and the applied signals before and after the rotation of the display substrate by 180°, thereby to simplify the testing of the display substrate and prevent the testing of the display substrate from being complicated and time-consuming.

During the implementation, the gate electrode of the first TFT T1 is arranged at a layer identical to the gate electrode of the second TFT T2, an active layer of the first TFT T1 is arranged at a layer identical to an active layer of the second TFT T2, and the source/drain electrodes of the first TFT T1 are arranged at a layer identical to the source/drain electrodes of the second TFT T2.

To be specific, the first TFT T1 is of a structure and polarity completely identical to the second TFT T2, i.e., the first TFT 1 and the second TFT T2 may be manufactured with identical process parameters during the manufacture of the display substrate, so as to reduce the number of steps. In addition, it is able to test the characteristics of the TFTs without changing the gate voltage signal applied by the first probe to the first testing terminal D1 and the third testing terminal D3 and the data signal applied by the second probe to the second testing terminal D2 and the fourth testing terminal D4 before and after the rotation of the display substrate by 180°. As a result, it is able to simplify the testing of the display substrate and prevent the testing of the display substrate from being complicated and time-consuming.

During the implementation, as shown in FIGS. 2a and 2b, the first testing terminal D1 is connected to the gate electrode of the first TFT T1, and the third testing terminal D3 is connected to the gate electrode of the second TFT T2. Hence, the gate electrodes of the first TFT T1 and the second TFT T2 may be arranged at a layer identical to the first testing terminal D1 and the third testing terminal D3. In this way, the same gate voltage signal may be applied by the first probe to the first testing terminal D1 and the third testing terminal D3 before and after the rotation of the display substrate by 180°, so as to test the characteristics of the first TFT T1 and the second TFT T2.

During the implementation, as shown in FIGS. 2a and 2b, the second testing terminal D2 is connected to the source electrode of the first TFT T1 and the drain electrode of the second TFT T2, and the fourth testing terminal D4 is connected to the drain electrode of the first TFT T1 and the source electrode of the second TFT T2. Hence, the source/drain electrodes of the first TFT T1 and the second TFT T2 may be arranged at a layer identical to the second testing terminal D2 and the fourth testing terminal D4. In this way, the same data signal may be applied by the second probe to the second testing terminal D2 and the fourth testing terminal D4 before and after the rotation of the display substrate by 180°, so as to test the characteristics of the first TFT T1 and the second TFT T2.

During the implementation, the display substrate may further include a display region where a plurality of TFTs for displaying is arranged.

The gate electrodes of the first TFT T1 and the second TFT T2 at the testing region are arranged at a layer identical to gate electrodes of the TFTs at the display region, the active layers of the first TFT T1 and the second TFT T2 at the testing region are arranged at a layer identical to active layers of the TFTs at the display region, and the source/drain electrodes of the first TFT T1 and the second TFT T2 at the testing region are arranged at a layer identical to source/drain electrodes of the TFTs at the display region.

To be specific, the first TFT T1 and the second TFT T2 at the testing region are of a structure and polarity identical to the TFTs at the display region, i.e., these TFTs may be manufactured with identical process parameters during the manufacture of the display substrate. In this way, after the characteristics of the first TFT T1 and the second TFT T2 at the testing region have been tested, it is able to determine that the same problems also occur for the TFTs at the display region when it is determined by comparing the testing data that the problems exist in the processing device, thereby to improve the manufacturing process and the product quality.

Figure 3:
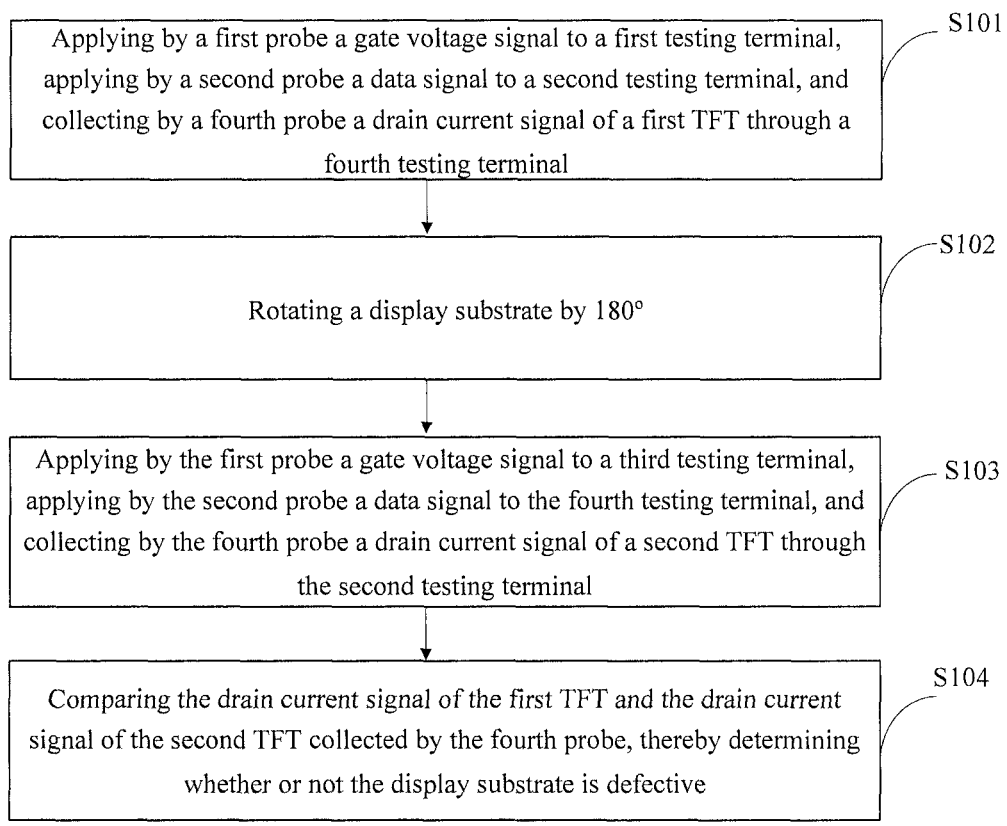
FIG. 3 is a flow chart of a method for testing the display substrate according to embodiments of the present disclosure.

Based on an identical inventive concept, the present disclosure provides in one embodiment a method for testing the above-mentioned display substrate which, as shown in FIG. 3, may include steps of:

S101: applying by the first probe a gate voltage signal to the first testing terminal, applying by the second probe a data signal to the second testing terminal, and collecting by the fourth probe a drain current signal of the first TFT through the fourth testing terminal;

S102: rotating the display substrate by 180°;

S103: applying by the first probe a gate voltage signal to the third testing terminal, applying by the second probe a data signal to the fourth testing terminal, and collecting by the fourth probe a drain current signal of the second TFT through the second testing terminal; and S104: comparing the drain current signal of the first TFT and the drain current signal of the second TFT collected by the fourth probe, thereby determining whether or not the display substrate is defective.

To be specific, before and after the rotation of the display substrate by 180°, the same gate voltage signal is applied by the first probe, the same data signal is applied by the second probe, and the drain current signal of the first TFT T1 and the second TFT T2 is collected by the fourth probe. As a result, it is unnecessary to change the positions of the probes and the applied signals after the rotation of the display substrate by 180°, thereby to simplify the testing of the display substrate and prevent the testing of the display substrate from being complicated and time-consuming. Then, the drain current signal of the first TFT and the drain current signal of the second TFT collected by the fourth probe are compared, so as to determine whether or not the display substrate is defective. When it is determined that the display substrate is defective, it is able to improve the product quality by improving the manufacturing process of the display substrate.

During the implementation, because the first TFT T1 is of a size and polarity identical to the second TFT T2, a gate on-state voltage of the first TFT T1 is identical to that of the second TFT T2, and the data signal applied to the source electrode of the first TFT T1 is identical to that applied to the source electrode of the second TFT T2 too. During the testing, the gate voltage signal applied by the first probe to the third testing terminal is identical to the gate voltage signal applied by the first probe to the first testing terminal, and the data signal applied by the second probe to the fourth testing terminal is identical to the data signal applied by the second probe to the second testing terminal. In this way, before and after the rotation of the display substrate by 180°, it is able to test the characteristics of the first TFT T1 and the second TFT T2 without changing the applied signals.

Figure 4:
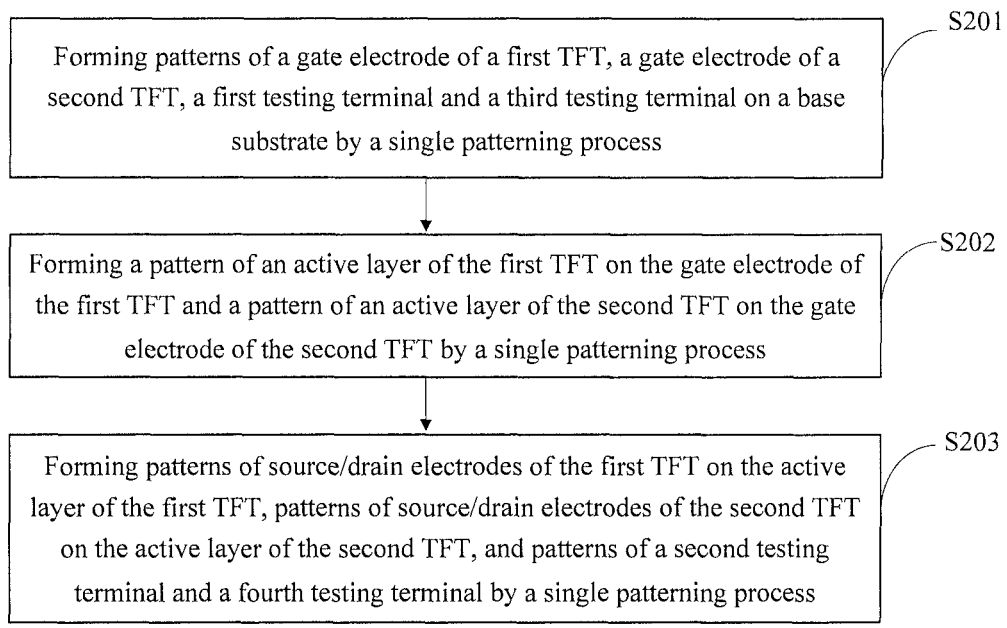
FIG. 4 is a flow chart of a method for manufacturing the display substrate according to embodiments of the present disclosure.

Based on an identical inventive concept, the present disclosure provides in one embodiment a method for manufacturing the above-mentioned display substrate which, as shown in FIG. 4, may include steps of:

S201: forming patterns of the gate electrode of the first TFT, the gate electrode of the second TFT, the first testing terminal and the third testing terminal on a base substrate by a single patterning process;

S202: forming a pattern of the active layer of the first TFT on the gate electrode of the first TFT and a pattern of the active layer of the second TFT on the gate electrode of the second TFT by a single patterning process; and S203: forming patterns of the source/drain electrodes of the first TFT on the active layer of the first TFT, patterns of the source/drain electrodes of the second TFT on the active layer of the second TFT, and patterns of the second testing terminal and the fourth testing terminal by a single patterning process.

During the implementation, the display substrate may be manufactured as follows.

1. A gate metal deposited onto a glass base substrate so as to form a gate metal layer, which is then etched by photolithography and a wet-etching method so as to form the gate electrodes of the first TFT and the second TFT, the first testing terminal and the third testing terminal.

2. An insulating material may be deposited onto the base substrate with the gate electrodes of the first TFT and the second TFT, the first testing terminal and the third testing terminal, so as to form a first insulating layer.

3. An oxide material may be deposited onto the base substrate with the first insulating layer, and then etched by a wet-etching method so as to form the active layers of the first TFT and the second TFT.

4. A layer of $SiO_2$ may be deposited onto the base substrate with the active layers of the first TFT and the second TFT so as to form an etch stop layer, which is then etched by a dry-etching method so as to remove the etch stop layer above channels of the active layers of the first TFT and the second TFT, e.g., the etch stop layer within black circles in FIGS. 2a and 2b, as well as the etch stop layer at the first testing terminal and the third testing terminal.

5. A source/drain metal may be deposited onto the resultant base substrate, and then etched by a wet-etching method so as to form the source/drain electrodes of the first TFT and the second TFT.

6. A passivation layer may be formed on the base substrate with the source/drain electrodes of the first TFT and the second TFT.

7. Via-holes may be formed on the first testing terminal, the second testing terminal, the third testing terminal and the fourth testing terminal of the base substrate with the passivation layer by photolithography and a dry-etching method.

According to the display substrate manufactured by the above-mentioned method, during the testing, it is unnecessary to change the positions of the probes and the applied signals before and after the rotation of the display substrate by 180°, thereby it is able to simplify the testing of the display substrate and prevent the testing of the display substrate from being complicated and time-consuming.

According to the display substrate, its testing method and its manufacturing method in the embodiments of the present disclosure, the first testing terminal is connected to the gate electrode of the first TFT, the second testing terminal is connected to the source electrode of the first TFT and the drain electrode of the second TFT, the third testing terminal is connected to the gate electrode of the second TFT, and the fourth testing terminal is connected to the drain electrode of the first TFT and the source electrode of the second TFT. During the testing, the gate voltage signal applied by the first probe to the third testing terminal after the rotation of the display substrate by 180° is identical to the gate voltage signal applied by the first probe to the first testing terminal before the rotation of the display substrate, and the data signal applied by the second probe to the fourth testing terminal after the rotation of the display substrate by 180° is identical to the data signal applied by the second probe to the second testing terminal before the rotation of the display substrate. Different from the related art, it is unnecessary in the embodiments of the present disclosure to change the positions of the probes and the applied signals after the rotation of the display substrate by 180°. As a result, it is able to simplify the testing of the display substrate and prevent the testing of the display substrate from being complicated and time-consuming and find the problems in the manufacturing process of the display substrate, thereby to improve the testing efficiency, the manufacturing process and the product quality.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A display substrate, comprising at least one testing region, wherein a first thin film transistor (TFT) and a second TFT with an identical size and an identical polarity, a first testing terminal, a second testing terminal, a third testing terminal and a fourth testing terminal are arranged at the testing region, wherein the first testing terminal is connected to a gate electrode of the first TFT, the second testing terminal is connected to a source electrode of the first TFT and a drain electrode of the second TFT, the third testing terminal is connected to a gate electrode of the second TFT, and the fourth testing terminal is connected to a drain electrode of the first TFT and a source electrode of the second TFT.

2. The display substrate according to claim 1, wherein the testing region is of a rectangle shape, the first testing terminal and the third testing terminal are arranged at two diagonal vertices of the rectangle, respectively, and the second testing terminal and the fourth testing terminal are arranged at the other two diagonal vertices of the rectangle, respectively.

3. The display substrate according to claim 1, wherein the gate electrode of the first TFT is arranged at a layer identical to the gate electrode of the second TFT, an active layer of the first TFT is arranged at a layer identical to an active layer of the second TFT, and the source/drain electrodes of the first TFT are arranged at a layer identical to the source/drain electrodes of the second TFT.

4. The display substrate according to claim 3, wherein the gate electrodes of the first TFT and the second TFT are arranged at a layer identical to the first testing terminal and the third testing terminal.

5. The display substrate according to claim 3, wherein the source/drain electrodes of the first TFT and the second TFT are arranged at a layer identical to the second testing terminal and the fourth testing terminal.

6. The display substrate according to claim 1, further comprising a display region, wherein a plurality of TFTs for displaying is arranged at the display region,
wherein the gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

7. The display substrate according to claim 2, further comprising a display region, wherein a plurality of TFTs for displaying is arranged at the display region,
wherein the gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

8. The display substrate according to claim 3, further comprising a display region, wherein a plurality of TFTs for displaying is arranged at the display region,
wherein the gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

9. The display substrate according to claim 4, further comprising a display region, wherein a plurality of TFTs for displaying is arranged at the display region,
wherein the gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

10. The display substrate according to claim 5, further comprising a display region, wherein a plurality of TFTs for displaying is arranged at the display region,
wherein the gate electrodes of the first TFT and the second TFT at the testing region are arranged at a layer identical to gate electrodes of the TFTs at the display region, the active layers of the first TFT and the second TFT at the testing region are arranged at a layer identical to active layers of the TFTs at the display region, and the source/drain electrodes of the first TFT and the second TFT at the testing region are arranged at a layer identical to source/drain electrodes of the TFTs at the display region.

11. The display substrate according to claim 1, further comprising a display region, wherein a plurality of TFTs for displaying is arranged at the display region,
wherein the first TFT and the second TFT at the testing region are each of a structure and a polarity identical to the TFTs at the display region.

12. A method for testing the display substrate according to claim 1, comprising:
applying by a first probe a gate voltage signal to a first testing terminal, applying by a second probe a data signal to a second testing terminal, and collecting by a fourth probe a drain current signal of a first thin film transistor (TFT) through a fourth testing terminal;
rotating the display substrate by 180°;
applying by the first probe a gate voltage signal to a third testing terminal, applying by the second probe a data signal to the fourth testing terminal, and collecting by the fourth probe a drain current signal of the second TFT through the second testing terminal; and
comparing the drain current signal of the first TFT and the drain current signal of the second TFT collected by the fourth probe, thereby determining whether or not the display substrate is defective.

13. The method according to claim 12, wherein
the gate voltage signal applied by the first probe to the third testing terminal is identical to the gate voltage signal applied by the first probe to the first testing terminal, and
the data signal applied by the second probe to the fourth testing terminal is identical to the data signal applied by the second probe to the second testing terminal.

14. A method for manufacturing the display substrate according to claim 1, comprising:
forming patterns of a gate electrode of a first thin film transistor (TFT), a gate electrode of a second TFT, a first testing terminal and a third testing terminal on a base substrate by a single patterning process;
forming a pattern of an active layer of the first TFT on the gate electrode of the first TFT and a pattern of an active layer of the second TFT on the gate electrode of the second TFT by a single patterning process; and
forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

15. A method for manufacturing the display substrate according to claim 2, comprising:
forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

16. A method for manufacturing the display substrate according to claim 3, comprising:

forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

17. A method for manufacturing the display substrate according to claim 4, comprising:

forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

18. A method for manufacturing the display substrate according to claim 5, comprising:

forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

19. A method for manufacturing the display substrate according to claim 6, comprising:

forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

20. A method for manufacturing the display substrate according to claim 11, comprising:

forming patterns of a gate electrode of a first thin film transistor (TFT), a gate electrode of a second TFT, a first testing terminal and a third testing terminal on a base substrate by a single patterning process;

forming a pattern of an active layer of the first TFT on the gate electrode of the first TFT and a pattern of an active layer of the second TFT on the gate electrode of the second TFT by a single patterning process; and forming patterns of source/drain electrodes of the first TFT on the active layer of the first TFT, patterns of source/drain electrodes of the second TFT on the active layer of the second TFT, and patterns of a second testing terminal and a fourth testing terminal by a single patterning process.

* * * * *